(12) United States Patent
Vuillermet et al.

(10) Patent No.: US 10,884,031 B2
(45) Date of Patent: Jan. 5, 2021

(54) CURRENT SENSOR SYSTEM

(71) Applicant: Allegro MicroSystems, LLC, Manchester, NH (US)

(72) Inventors: Yannick Vuillermet, Voglans (FR); Andreas P. Friedrich, Metz-Tessy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 263 days.

(21) Appl. No.: 15/999,122

(22) Filed: Aug. 17, 2018

(65) Prior Publication Data

US 2020/0057097 A1 Feb. 20, 2020

(51) Int. Cl.
*G01R 15/20* (2006.01)
*G01R 19/00* (2006.01)
*G01R 33/025* (2006.01)

(52) U.S. Cl.
CPC ......... *G01R 15/205* (2013.01); *G01R 15/202* (2013.01); *G01R 33/025* (2013.01)

(58) Field of Classification Search
CPC .... G01R 15/20; G01R 15/202; G01R 15/205; G01R 15/207; G01R 19/00; G01R 33/025; G01R 33/07; G01R 33/09
See application file for complete search history.

(56) References Cited

U.S. PATENT DOCUMENTS

| | | |
|---|---|---|
| 4,757,420 A | 7/1988 | Saletta et al. |
| 6,300,617 B1 | 10/2001 | Daughton et al. |
| 6,583,613 B1 * | 6/2003 | Hohe ............. G01R 15/20 324/117 R |
| 7,746,056 B2 | 6/2010 | Stauth et al. |
| 7,923,996 B2 | 4/2011 | Doogue et al. |
| 8,030,918 B2 | 10/2011 | Doogue et al. |
| 8,447,556 B2 | 5/2013 | Friedrich et al. |

(Continued)

FOREIGN PATENT DOCUMENTS

GB 2547732 8/2017
WO WO 2017/144715 A1 8/2017

OTHER PUBLICATIONS

Final Office Action dated Jan. 24, 2020 for U.S. Appl. No. 15/435,725; 25 pages.

(Continued)

*Primary Examiner* — Neel D Shah
(74) *Attorney, Agent, or Firm* — Daly, Crowley, Mofford & Durkee, LLP

(57) ABSTRACT

Apparatus and methods provide a current sensor system including a plurality of current sensors positioned proximate a plurality of conductors. Each conductor is configured to carry a current to be measured. Each current sensor comprises one or more magnetic field sensing elements configured to generate a respective magnetic field signal indicative of a detected magnetic field. The plurality of current sensors includes a first number of current sensors and the plurality of conductors includes a second number of conductors such that the first number is at least one more than the second number. A controller is coupled to receive the magnetic field signal from each of the current sensors and, for each magnetic field sensing element, is configured to characterize a magnetic coupling between the magnetic field sensing element and each of the plurality of conductors.

29 Claims, 9 Drawing Sheets

(56) References Cited

U.S. PATENT DOCUMENTS

| | | |
|---|---|---|
| 8,542,010 B2 | 9/2013 | Cesaretti et al. |
| 8,680,846 B2 | 3/2014 | Cesaretti et al. |
| 8,692,546 B2 | 4/2014 | Cesaretti et al. |
| 8,818,749 B2 | 8/2014 | Friedrich et al. |
| 8,896,295 B2 | 11/2014 | Friedrich et al. |
| 8,907,669 B2 | 12/2014 | Petrie |
| 9,081,041 B2 | 7/2015 | Friedrich et al. |
| 9,151,807 B2 | 10/2015 | Friedrich et al. |
| 9,201,122 B2 | 12/2015 | Cesaretti et al. |
| 2007/0279053 A1 | 12/2007 | Taylor et al. |
| 2012/0001617 A1 | 1/2012 | Reynolds |
| 2012/0253726 A1 | 10/2012 | Xu |
| 2013/0015843 A1 | 1/2013 | Doogue et al. |
| 2014/0266181 A1 | 9/2014 | Milano et al. |
| 2014/0312883 A1 | 10/2014 | Friedrich et al. |
| 2015/0301149 A1 | 10/2015 | Cesaretti et al. |
| 2015/0331079 A1 | 11/2015 | Kolwalkar et al. |
| 2015/0338444 A1 | 11/2015 | Ivanov et al. |
| 2015/0362532 A1 | 12/2015 | Chartouni |
| 2016/0011239 A1* | 1/2016 | Yoon .................. G01R 19/0046 324/126 |
| 2016/0274060 A1 | 9/2016 | Denenberg et al. |
| 2018/0238938 A1 | 8/2018 | Feucht |

OTHER PUBLICATIONS

Response to Office Action dated Oct. 18, 2019, for U.S. Appl. No. 15/435,725; 13 pages.

Amendment and Request for Continued Examination (RCE) dated Mar. 31, 2020 for U.S. Appl. No. 15/435,725; 14 pages.

Notice of Allowance dated Jun. 7, 2019 for European Application No. 18154879.3; 7 Pages.

Office Action dated Sep. 24, 2019 for U.S. Appl. No. 15/435,725; 25 Pages.

Response filed on Feb. 22, 2019 for European Application No. 18154879.3; 20 Pages.

Extended European Search Report dated Jul. 10, 2018 for EP Application No. 18154879.3; 10 Pages.

Melexis Inspired Engineering; "Current Sensors Reference Design Guide"; Aug. 2016; 27 Pages.

Notice of Allowance dated Jun. 9, 2020 for U.S. Appl. No. 15/435,725; 8 pages.

* cited by examiner

CURRENT SENSOR SYSTEM

CROSS REFERENCE TO RELATED APPLICATIONS

Not Applicable.

STATEMENT REGARDING FEDERALLY SPONSORED RESEARCH

Not Applicable.

FIELD

The present disclosure relates generally to methods for determining current in a conductor using magnetic field sensors.

BACKGROUND

Some conventional electrical current sensors are positioned near a current-carrying conductor to sense a magnetic field generated by the current through the conductor. The current sensor generates an output signal having a magnitude proportional to the magnetic field induced by the current through the conductor.

The accuracy with which a magnetic field-based current sensor senses an intended current can be affected by its immunity to stray magnetic fields. Some conventional current sensors employ a ferromagnetic core to increase the coupling between the current flowing in the conductor and the magnetic field magnitude. The core may provide a shielding to stray field immunity or, if no ferromagnetic core is used, the magnetic field is directly sensed, and a ferromagnetic shield may be provided around the system to reduce any effects of stray fields disturbing the current measurement.

SUMMARY

The present disclosure can provide a magnetic field sensor that provides compensation techniques for current measurement systems to increase current measurement accuracy, reduce the impact of uniform stray fields, and adds redundancy to the measurement system. The current sensor system includes a plurality of current sensors and a plurality of conductors. Each of the conductors carries a current intended to be measured. The current sensors include one or more magnetic field sensing elements configured to generate a magnetic field signal indicative of a detected magnetic field.

However, magnetic coupling can occur in a current measurement system between a current sensor and conductors carrying currents that are not intended to be measured by the current sensor.

Systems and methods described herein can be used to characterize magnetic coupling between a magnetic field sensing element and each of the plurality of conductors. In an embodiment, the coupling factors can be determined by applying a reference current at a predetermined level to each of the conductors. For example, a characterization measurement can be performed by forcing a sufficiently high current through one conductor and measuring the outputs of each of the magnetic field sensing elements in the current sensor system. The characterization measurement provides the coupling factor between the magnetic field sensing element and each conductor. The characterization measurement can be repeated for each conductor. The coupling factors can be provided in units of sensor output voltage per conductor current (e.g., mV/A).

In a first aspect, a current sensor system includes a plurality of current sensors positioned proximate to a plurality of conductors each configured to carry a current to be measured, each current sensor comprising one or more magnetic field sensing elements configured to generate a respective magnetic field signal indicative of a detected magnetic field. The plurality of current sensors includes a first number of current sensors and the plurality of conductors includes a second number of conductors such that the first number is at least one more than the second number, meaning there is at least one more current sensor than conductor. A controller is coupled to receive the magnetic field signal from each of the plurality of current sensors, and, for each magnetic field sensing element, configured to characterize a magnetic coupling between the magnetic field sensing element and each of the plurality of conductors.

For each magnetic field sensing element, the controller is further configured to determine a coupling factor indicative of a magnetic coupling between the magnetic field sensing element and each of the plurality of conductors and use the coupling factors to determine the current in one or more of the plurality of conductors. The controller can comprise a processor configured to generate a coupling matrix [A] comprising the coupling factors for each magnetic field sensing element. The processor can be further configured to extract a best fit current vector [I] for a matrix equation A×I=H, where [A] is the coupling matrix and [H] is a matrix comprising the magnetic field signals from the plurality of current sensors. The processor can further be configured to solve the matrix equation A×I=H using a least squares method or pseudo-inverse to thereby generate a matrix [C] such that I=C×H. The processor can comprise a multiplier configured to multiply the magnetic field signal from each of the plurality of current sensors by the matrix [C].

In accordance with an embodiment, the one or more magnetic field sensing elements of each of the plurality of current sensors has a maximum sensitivity in the same direction, and the controller comprises a processor configured to generate a coupling matrix [D] comprising the coupling factors for each of the plurality of magnetic field sensing elements and stray field coefficients. The processor can further be configured to extract a best fit vector [J] for a matrix equation D×J=H, where [D] is the coupling matrix and [H] is a matrix comprising the magnetic field signals from the plurality of current sensors. The processor can further be configured to solve the matrix equation D×J=H using an inversion method or a least squares method or pseudo-inverse to generate a matrix [F] such that J=F×H.

In one aspect, the plurality of conductors comprise busbars. In one aspect, the one or more magnetic field sensing elements comprise one or more of magnetoresistance elements or Hall effect elements. In one aspect, the one or more magnetic field sensing elements comprises one or more giant or tunnel magnetoresistance elements.

In another aspect, a method for determining a current in one or more of a plurality of conductors is provided. The method comprises providing a plurality of current sensors having a first number of current sensors, each current sensor comprising one or more magnetic field sensing elements configured to generate a respective magnetic field signal indicative of a detected magnetic field, providing a plurality of conductors having a second number of conductors, each configured to carry a current to be measured, wherein the second number is at least one less than the first number, for each magnetic field sensing element, characterizing a magnetic coupling between the magnetic field sensing element and each of the plurality of conductors, and using the magnetic coupling characterization to determine the current in one or more of the plurality of conductors.

Characterizing the magnetic coupling between the current sensor and each of the plurality of conductors can comprise determining a coupling factor indicative of a magnetic coupling between the magnetic field sensing element and each of the plurality of conductors and generating a coupling matrix comprising one or more coupling factors for each magnetic field sensing element. The method can further comprise extracting a best fit current vector [I] for a matrix equation A×I=H, where [A] is the coupling matrix and [H] is a matrix comprising the magnetic field signals from the plurality of current sensors. The method can further comprise solving the matrix equation A×I=H using a least squares method or a pseudo-inverse to thereby generate a matrix [C] such that I=C×H. The method can further comprise multiplying the magnetic field signal from each magnetic field sensing element by the matrix [C].

In some aspects, the one or more magnetic field sensing elements of each of the plurality of current sensors has a maximum sensitivity in the same direction, and the method further comprises generating a coupling matrix [D] comprising the coupling factors for each magnetic field sensing element and stray field coefficients. The method can further comprise extracting a best fit vector [J] for a matrix equation D×J=H, where [D] is the coupling matrix and [H] is a matrix comprising the magnetic field signals from the plurality of current sensors. The method can further comprise solving the matrix equation D×J=H using an inversion method or a least squares method or a pseudo-inverse to generate a matrix [F] such that J=F×H.

In another aspect, a current sensor system comprises a plurality of current sensors having a first number of current sensors, each current sensor comprising one or more magnetic field sensing elements configured to generate a respective magnetic field signal indicative of a detected magnetic field, a plurality of conductors having a second number of conductors, each configured to carry a current to be measured, wherein the second number is at least one less than the first number, means for characterizing a magnetic coupling between each magnetic field sensing element and each of the plurality of conductors, and means for using the magnetic coupling characterization to determine the current in one or more of the plurality of conductors.

In one aspect, the means for characterizing the magnetic coupling between the magnetic field sensing element and each of the plurality of conductors comprises means for determining a coupling factor indicative of a magnetic coupling between the magnetic field sensing element and each of the plurality of conductors and means for generating a coupling matrix comprising one or more coupling factors for each magnetic field sensing element. The current sensor system can further include means for extracting a best fit current vector [I] for a matrix equation A×I=H, where [A] is the coupling matrix and [H] is a matrix comprising the magnetic field signals from the plurality of current sensors. The current sensor system can further include means for solving the matrix equation A×I=H using a least squares method or a pseudo-inverse to thereby generate a matrix [C] such that I=C×H.

In another aspect, the one or more magnetic field sensing elements of each of the plurality of current sensors has a maximum sensitivity in the same direction, and the method further comprises means for generating a coupling matrix [D] comprising the coupling factors for each magnetic field sensing element and stray field coefficients. The current sensor system can further include means for extracting a best fit vector [J] for a matrix equation D×J=H, where [D] is the coupling matrix and [H] is a matrix comprising the magnetic field signals from the plurality of current sensors. The current sensor system can further include means for solving the matrix equation D×J=H using an inversion method or a least squares method or a pseudo-inverse to generate a matrix [F] such that J=F×H.

BRIEF DESCRIPTION

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

Before describing the present invention, some introductory concepts and terminology are explained.

As used herein, the term "magnetic field sensing element" is used to describe a variety of electronic elements that can sense a magnetic field and generate a magnetic field signal responsive to the magnetic field sensing element. The magnetic field sensing element can be, but is not limited to, a Hall-effect element, a fluxgate, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Figure 1:
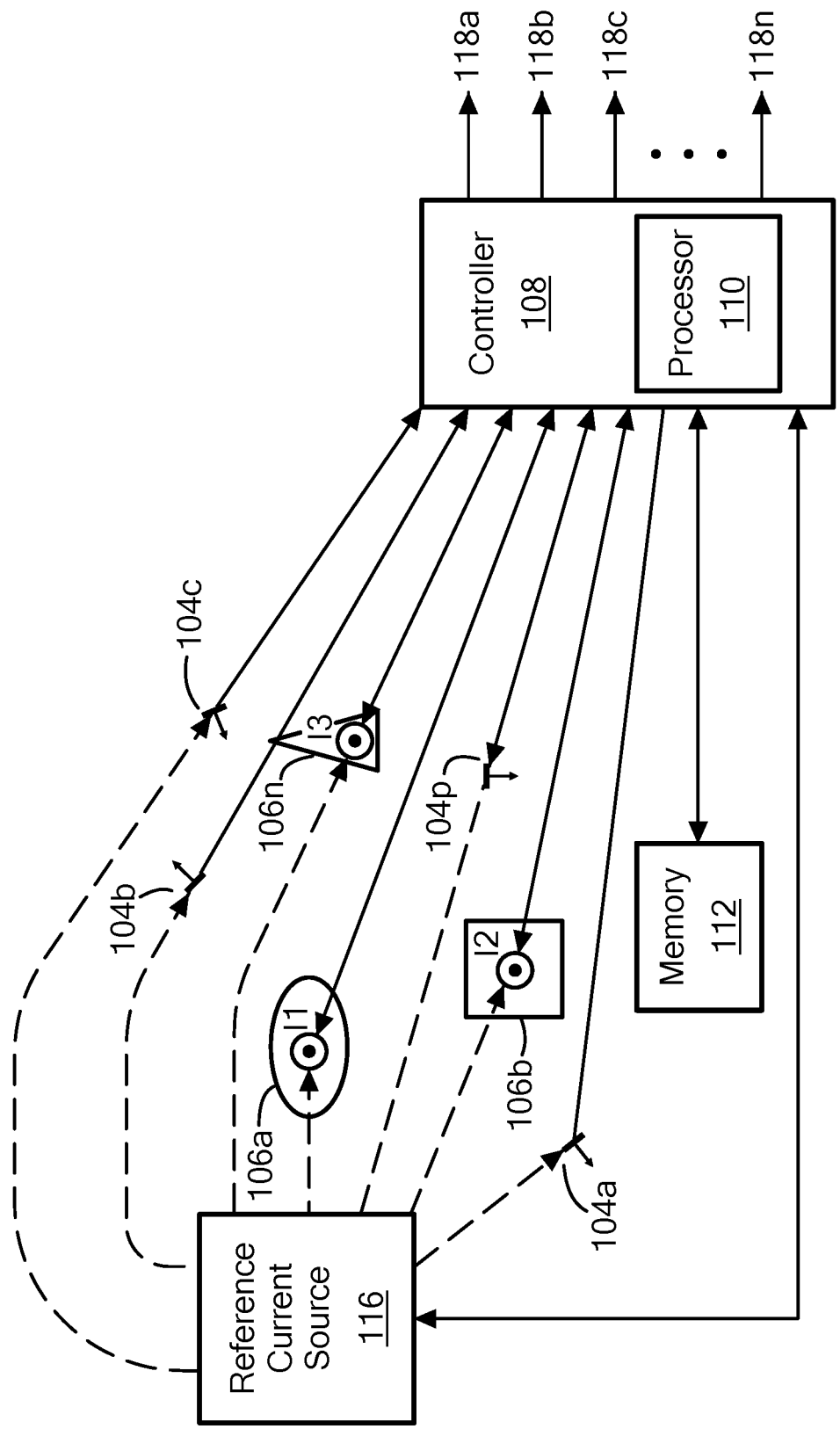
FIG. 1 shows a current sensor system having a plurality of current sensors and a plurality of current carrying conductors, according to the present disclosure.

Now referring to FIG. 1, a current sensor system is provided having a plurality of current sensors 104a-104p (104a, 104b, 104c, . . . , 104p) and a plurality of conductors 106a-106n (106a, 106b, . . . , 106n), each conductor configured to carry a current to be measured, according to the present disclosure. As shown in FIG. 1, the number of current sensors is at least one greater than the number of conductors, as will be appreciated upon reading the present disclosure, and described in greater detail below. Each of the current sensors 104a-104p includes one or more magnetic field sensing elements that can measure the current through one or more of the conductors 106a-106n by measuring the magnetic field, given that there is a linear relationship between the magnetic field measured by the sensors ("m" magnetic field sensing elements) and the current flowing in the conductors ("n" conductors), where $m \geq p > n$, where "p" is the number of current sensors. It will be appreciated that although FIG. 1 is a 2D view of the sensors and conductors, the principle applies to an arbitrary 3D configuration of busbars and sensors. In this example, there are four sensors and three conductors (i.e., busbars) carrying three currents (I1, I2, and I3). The arrows indicate the maximum sensitivity direction of each current sensor.

The magnetic field-based current sensor (or simply "current sensor") 100 includes at least one magnetic field sensing element (see, e.g., magnetic field sensing element 310 in FIG. 3) that generates a magnetic field signal responsive to a magnetic field proximate to the magnetic field sensing element. The term "magnetic field-based current sensor" 100 or simply "current sensor" is used to describe a circuit that includes one or more magnetic field sensing elements, generally in combination with other circuits, used to determine a current. Although some embodiments may only show or describe one magnetic field sensing element, it will be appreciated that each current sensor can have more than one magnetic field sensing element.

The current sensor 100 can be used in a variety of applications, including, but not limited to, a current sensor that senses a magnetic field generated by a current carried by a current-carrying conductor or a magnetic field sensor that senses a magnetic field density of a magnetic field to determine a current. The magnetic field sensing element(s) of each current sensor 104a-104p can be any magnetic field sensing element disclosed herein (e.g., Hall effect element, a magnetoresistance element, or a magnetotransistor), and each current sensor can include one or more such elements of the same or different types.

Each of the current sensors 104a-104p includes one or more magnetic field sensing elements configured to sense a magnetic field generated by a current through one or more of conductors 106a-106n and generate a magnetic field signal indicative of a detected magnetic field. Again, magnetic coupling from one or more conductors adjacent to (rather than proximate to) the current sensor may occur. Magnetic field sensing elements may include one or more Hall effect elements and/or magnetoresistance elements. The magnetoresistance element may include at least one of an Indium Antimonide (InSb) element, a giant magnetoresistance (GMR) element, an anisotropic magnetoresistance (AMR) element, a tunneling magnetoresistance (TMR) element or a magnetic tunnel junction (MTJ) element.

Conductors 106a-106n can be coupled to a reference current source 116. Reference current source 116 can generate a reference current and provide the reference current to each of conductors 106a-106n. The reference current can be provided to conductors 106a-106n individually. For example, the reference current may be provided to conductors 106a-106n one at a time, such as in a predetermined order or randomly. In some embodiments, reference current source 116 can provide multiple reference currents to each of conductors 106a-106n. For example, in one embodiment, a sequence of reference currents may be provided to each of conductors 106a-106n.

Reference current source 116 may form part of the current sensor system 100. In other embodiments, reference current source 116 may be external to, and thus may be coupled to current sensor system 100 to provide one or more reference currents.

A controller 108 can be coupled to each of current sensors 104a-104p, to each of the conductors 106a-106n, and to the reference current source 116. For example, an output of each of current sensors 104a-104p can be coupled to an input of controller 108. During operational times when the current sensor system 100 is characterizing magnetic coupling within the system, the controller 108 can receive an output signal (e.g., magnetic field signal) from each of current sensors 104a-104p that corresponds to a magnetic field attributable to the reference current provided to conductors 106a-106n. Controller 108 can also control the reference current source 116, such as to establish the reference current level and control the timing and ordering with which the reference current is provided to each of the conductors 106a-106n.

Functionality of the controller 108 will be described further below. As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device (e.g., memory 112). A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

Controller 108 can use the output signals from the current sensors 104a-104p to characterize magnetic coupling between each of the magnetic field sensing element(s) of the current sensors 104a-104p and the plurality of conductors 106a-106n. In an embodiment, a magnetic coupling factor as used herein refers to the magnetic coupling between one or more magnetic field sensing element(s) of a current sensor and the one or more conductors 106a-106n carrying current intended to be measured.

Controller 108 may include a plurality of outputs 118a-118n. For example, in some embodiments, controller 108 may include an output 118a-118n for each conductor 104a-104n.

In an embodiment, controller 108 may include a processor 110 and a memory 112. In some embodiments, memory 112 may be separate from controller 108 but communicatively coupled to controller 108 or may be part of the controller 108. In an embodiment, controller 108 may be a computing device configured to receive current sensor output data and determine magnetic coupling factors within current sensor system 100.

Memory 112 may include a volatile memory and/or a non-volatile memory. For example, the non-volatile memory can store computer instructions, an operating system and/or data for current sensor system 100. The data may include output signals and/or magnetic field signals received from each of current sensors 104a-104p. The data may further include one or more coupling matrices, one or more inverse coupling matrices, coupling factor information, reference current information, and/or measured current information, as will be appreciated in light of the present disclosure.

In some embodiments, each of current sensors 104a-104p may include integrated magnetic field sensing elements. For example, one or more magnetic field sensing elements may be provided in the form of an integrated circuit and/or include additional processing circuitry (e.g., circuitry shown in FIG. 3) and can be encapsulated with an electrically insulating material within current sensors 104a-104p. The magnetic field sensing elements and additional circuitry can be formed on a single semiconductor die, which is encapsulated and provided in the form of a single integrated circuit current sensor. In an alternate embodiment, the magnetic field sensing elements and additional circuitry can be formed on separate semiconductor die coupled with wire bonds or the like in a single or in multiple integrated circuit packages.

Figure 2:
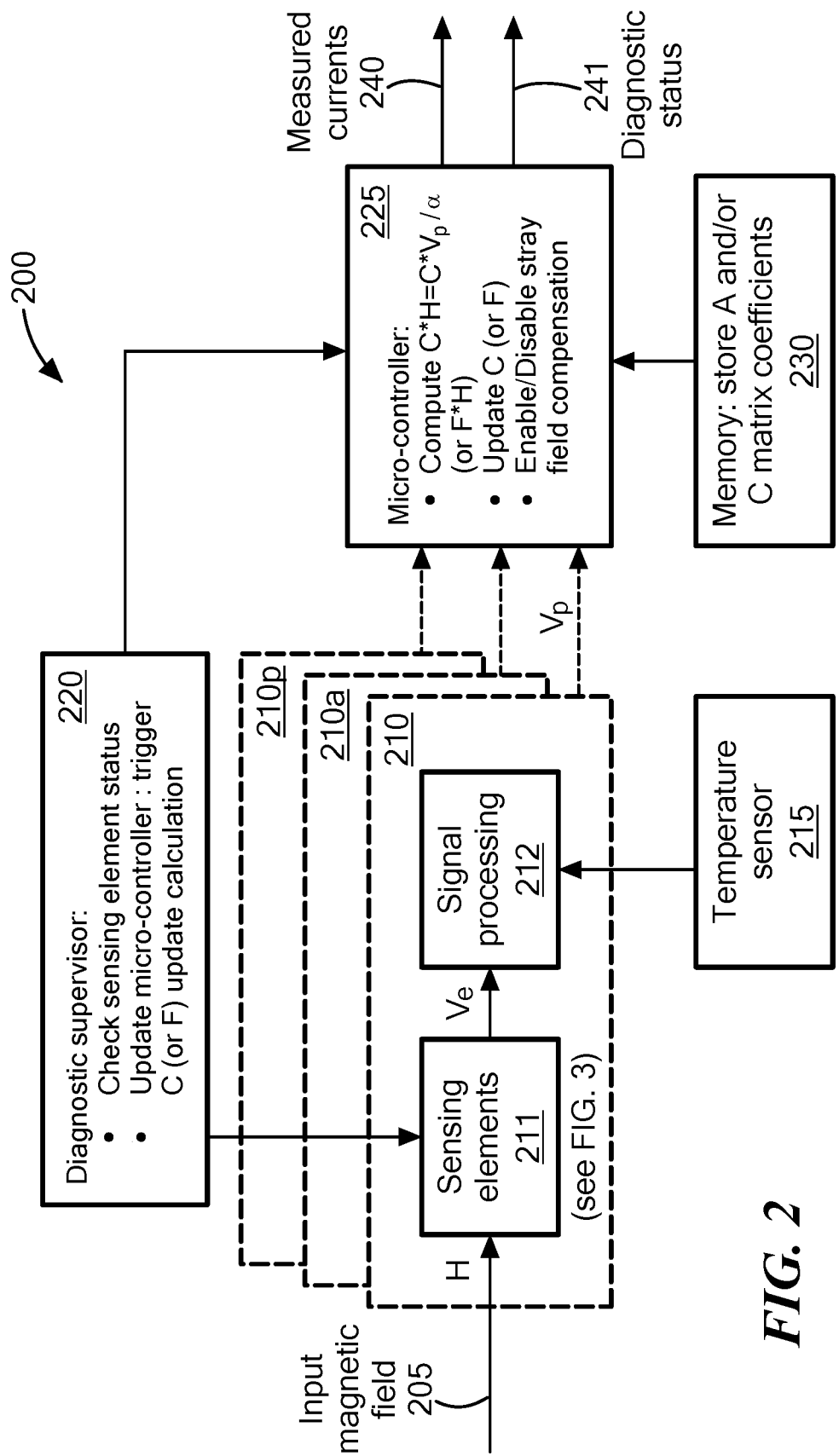
FIG. 2 is a block diagram of a current sensor system according to the present disclosure, showing the flow between the magnetic field sensing elements, the diagnostic supervisor, and the micro-controller.

FIG. 2 shows an example block diagram of a current sensor system 200, showing the flow between the magnetic field sensing elements, a diagnostic supervisor, and a micro-controller, according to the present disclosure. The current sensor 210 (see FIG. 3 for an example circuit diagram) responds to an input magnetic field 205. It will be appreciated that although only one current sensor 210 is shown coupled to the micro-controller 225, that multiple sensors 210a-210p (shown in dotted-line) can also be coupled to the micro-controller 225. In the current sensor 210, the magnetic sensing element(s) 211 measure(s) the magnetic field H and convert(s) the magnetic field into an electrical signal (Ve). This signal is processed to apply compensation at 212 (gain and offset) versus temperature (e.g., from temperature sensor 215), for example. The processed voltage is Vp=α·H with a being the transducer gain (in V/G for example). The processed voltage Vp is sent to a micro-controller 225. The microcontroller 225 evaluates the currents using the matrix product, as described in greater detail herein with respect to FIG. 7. The C or F matrix comes from the memory 230 (which may be the same as memory 112 in FIG. 1), as is described in greater detail herein.

The diagnostic supervisor 220, for example, can reside within the controller 108, or be a separate microcontroller coupled to the processor 110. Likewise, the micro-controller 225 can be part of the controller 108 or separate from the controller 108 and coupled to the controller 108 and/or the processor 110. When diagnostic/redundancy is required, a diagnostic supervisor 220 checks that all sensing elements work properly. For example, for a Hall plate integrated sensor, this can be achieved by an integrated coil on top of the Hall plate that, when working properly, the Hall plate should respond to a calibrated pulse in the coil. This calibrated pulse can be sent, for example, from the integrated circuit (IC) itself (210). If one (or more) sensing elements is out of order, the supervisor 220 tells the micro-controller 225 to ignore the signal from this sensing element and to update the matrix equation to be re-calculated without the line from the faulty sensing element (as described in greater detail herein with respect to FIG. 7, for example). Accordingly, the micro-controller 225 uses the matrix [A] stored in memory 230. The output of the micro-controller 225 is the measured currents 240 or a diagnostic status 241 as described in greater detail herein.

Figure 3:
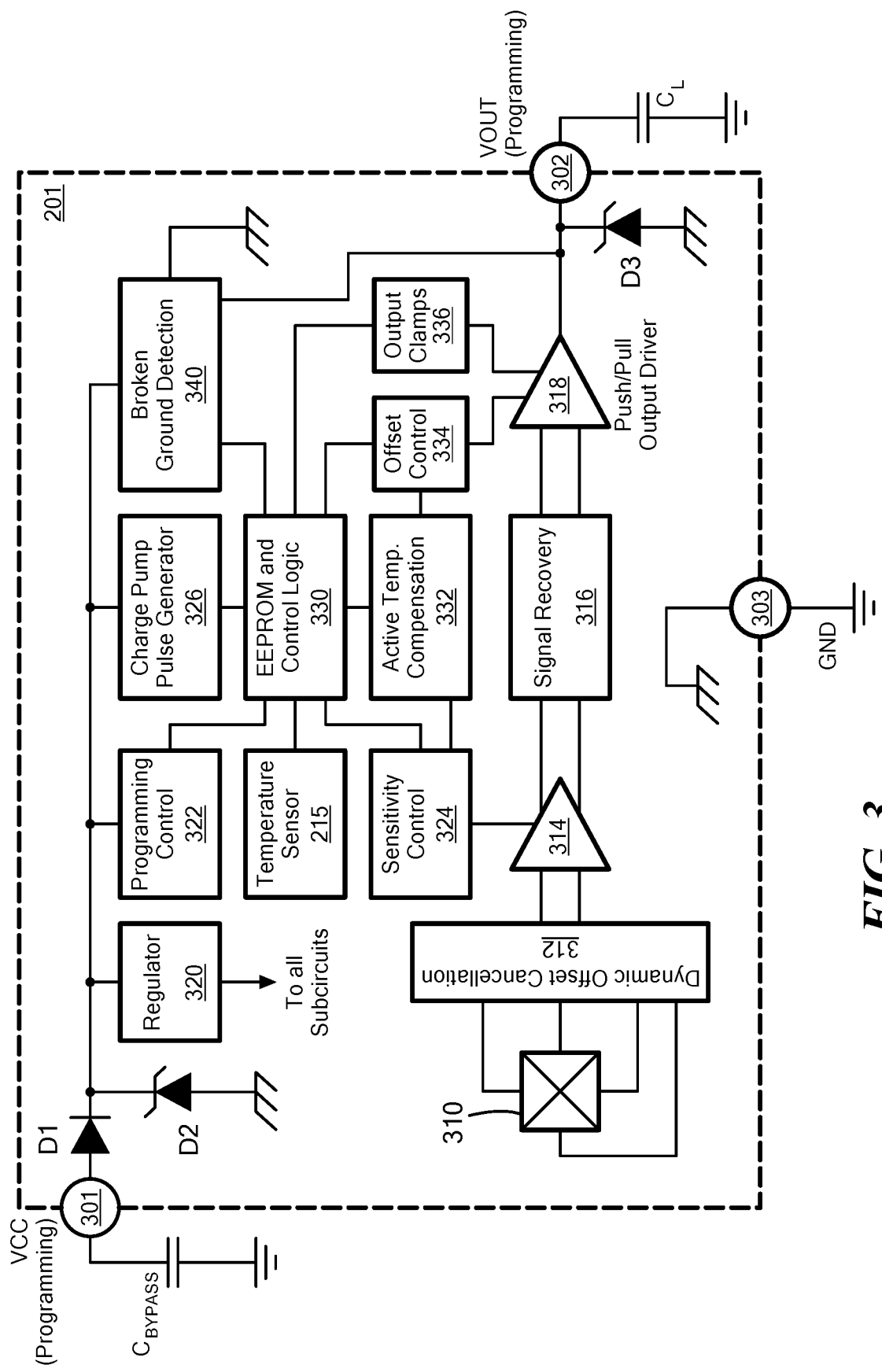
FIG. 3 is a block diagram showing an example current sensor for a current sensor system, according to the present disclosure.

FIG. 3 is a block diagram showing an example current sensor 210, according to the present disclosure. The example current sensor 210 includes, for example, one magnetic field sensing element 211 and a signal processing circuit 212 shown in FIG. 2. The example current sensor 210 shown in FIG. 3 can be the sensor 210 of FIG. 2 and can include a magnetic field sensing element 310. Although only one magnetic field sensing element is shown in FIG. 3, it will be appreciated that more than one magnetic field sensing element can be provided per current sensor.

The example current sensor 210 includes three pins in this embodiment, including a VCC (supply voltage) pin 301, a VOUT (output signal) pin 302, and a GND (ground) pin 303. The VCC pin 301 is used for the input power supply or supply voltage for the current sensor 210. A bypass capacitor, CBYPASS, can be coupled between the VCC pin 301 and ground. The VCC pin 301 can also be used for programming the current sensor 210. The VOUT pin 302 is used for providing the output signal for the current sensor 210 and can also be used for programming. An output load capacitance CL is coupled between the VOUT pin 302 and ground. The example current sensor can include a first diode D1 coupled between the VCC pin 301 and the regulator 320, a second diode D2 coupled between the chassis ground and the first diode D1, and a third diode D3 coupled between the VOUT pin 302 and chassis ground.

The magnetic field signal generated by the magnetic field sensing element 310 is input to a dynamic offset cancellation circuit 312, which is output to an amplifier 314. The amplifier 314 is coupled to receive the magnetic field signal from the magnetic field sensing element 310 and generate an amplified signal for coupling to the signal recovery circuit 316. Dynamic offset cancellation circuit 312 may take various forms including chopping circuitry and may function in conjunction with offset control 334 to remove offset that can be associated with the magnetic field sensing element 310 and/or the amplifier 314. For example, offset cancellation circuit 312 can include switches configurable to drive the magnetic field sensing element (e.g., Hall plate) in two or more different directions such that selected drive and signal contact pairs are interchanged during each phase of the chopping clock signal and offset voltages of the different driving arrangements tend to cancel. A regulator 320 is coupled between a supply voltage VCC and ground and to the various components and sub-circuits of the sensor 210 to regulate the voltage supplied thereto.

A programming control circuit 322 is coupled between the VCC pin 301 and the EEPROM and control logic 330 to provide appropriate control to the EEPROM and control logic circuit 330. A charge pump pulse generator 326 uses a switching device to control the connection of the supply voltage (VCC) across a load through a capacitor, and thereby generates pulses. EEPROM and control logic circuit 330 determines any application-specific coding and can be erased and reprogrammed using a pulsed voltage, for example as provided by the charge pump pulse generator circuit 326. A sensitivity control circuit 324 can be coupled to the amplifier 314. The sensitivity control circuit 324 can generate and provide a sensitivity control signal to the amplifier 314 to adjust a sensitivity and/or operating voltage of the amplifier 314. The output of the amplifier 314 is coupled to the input of the signal recovery circuit 316. An active temperature compensation circuit 332 can be coupled to sensitivity control circuit 324, EEPROM and control logic circuit 330, and offset control circuit 334. The offset control circuit 334 can generate and provide an offset signal to a push/pull driver circuit 318 (which may be an amplifier) to adjust the sensitivity and/or operating voltage of the driver circuit 318. The active temperature compensation circuit 332 can acquire temperature data from EEPROM and control logic circuit 330 via the temperature sensor 215 and perform necessary calculations to compensate for changes in temperature, if needed. Output clamps circuit 336 is coupled between the EEPROM and control logic 330 and the push/pull driver 318. The output clamps circuit 336 can be used to limit the output voltage and may often be used for diagnostics. For example, if the total output range can be from 0V to 5V, for magnetic field from 0 G to 1000 G, it may be desired to use a clamp at 0.5V for any field below 100 G. For example, it may be known that below 100 G, the IC does not return a trustable signal. Hence, if the IC output is 0.5V, it is evident that the measurement is not valid and cannot be trusted. Or clamps at 1V and 4V could be used and the 0-1V and 4-5V range is used for passing diagnostic information: 4.5V on the output could mean "Hall plate is dead" and 0.5V could mean "Undervoltage VCC detected", etc. The current sensor 210 can also include a broken ground detection circuit 340 coupled between the input VCC 301 and the chassis ground, to indicate when a broken ground connection has been detected.

The output terminal 302 (VOUT) can be coupled to a system controller (e.g., controller 108 in FIG. 1) and provide a magnetic field signal indicative of a detected magnetic field to the controller for processing.

It will be appreciated that FIG. 3 shows an example current sensor primarily as a digital implementation. However, any appropriate current sensor can be used in accordance with the present disclosure, including both digital and analog implementations.

Figure 4:
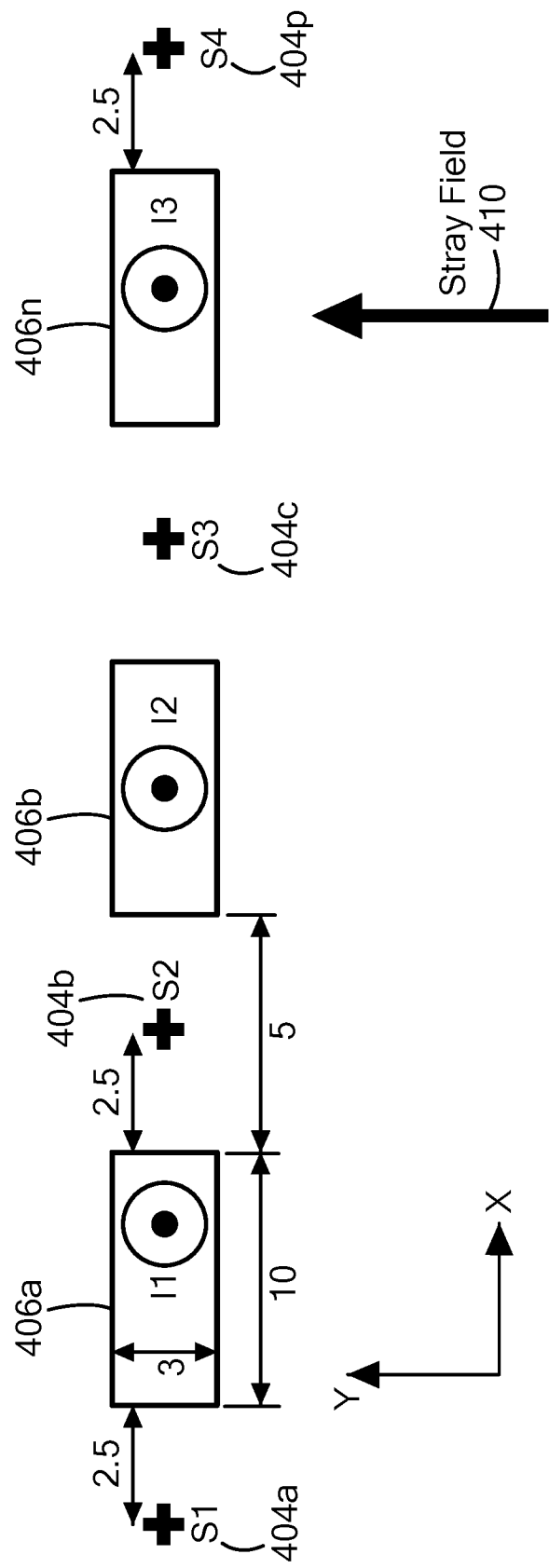
FIG. 4 is a current sensor system having a plurality of current sensors and a plurality of current carrying conductors and further showing a stray field applied to the current sensor system, according to the present disclosure.
Figure 5A:
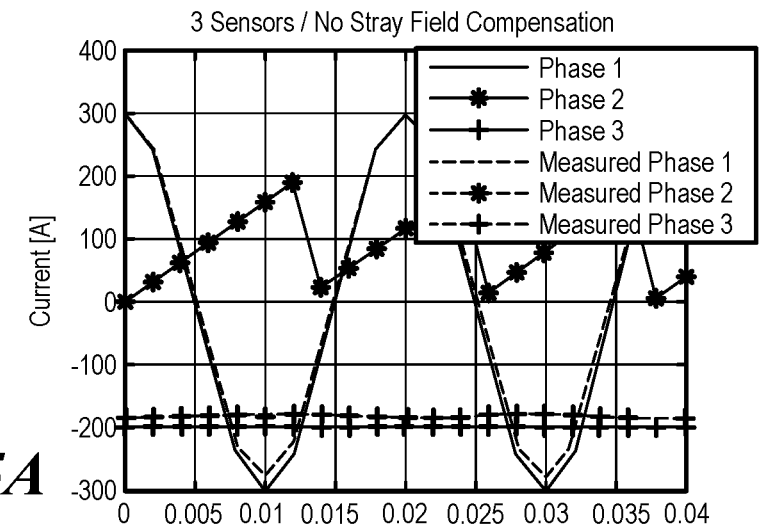
FIGS. 5A-5F are graphical diagrams showing the measured current at various current sensors and the associated error, according to the present disclosure.
Figure 5C:
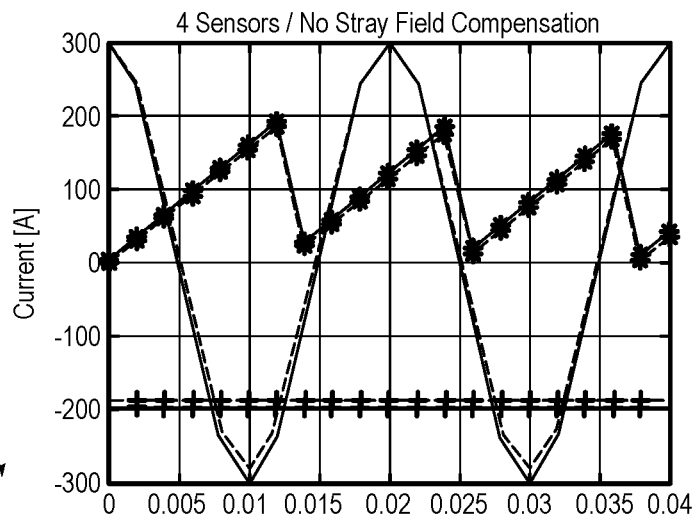
Figure 5E:
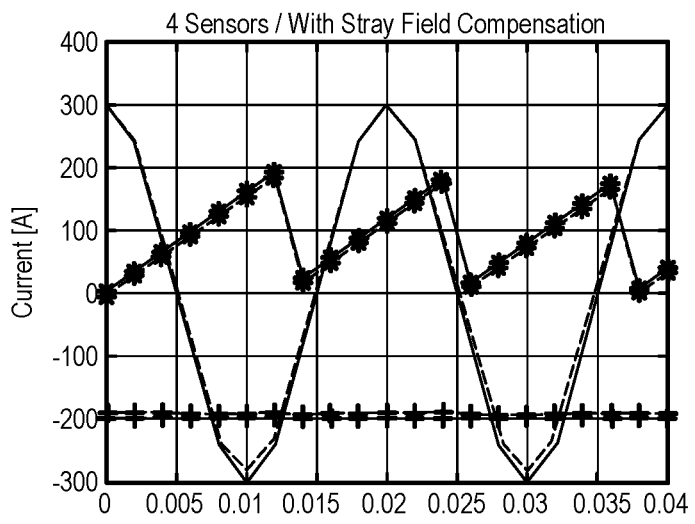
Figure 5B:
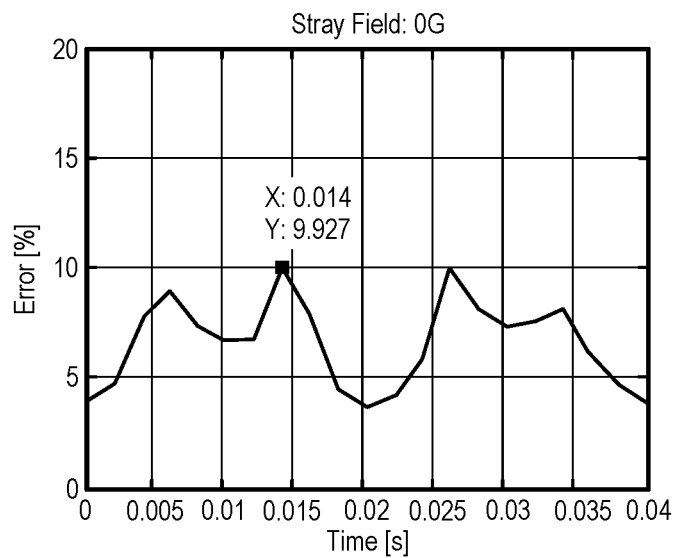
Figure 5D:
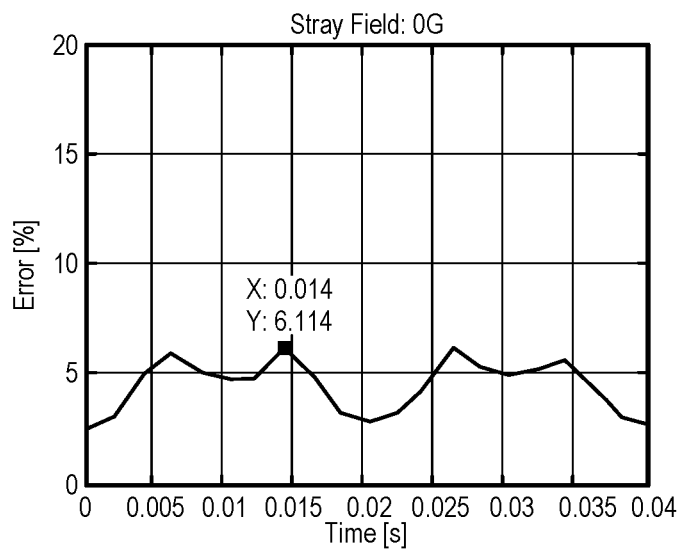
Figure 5F:
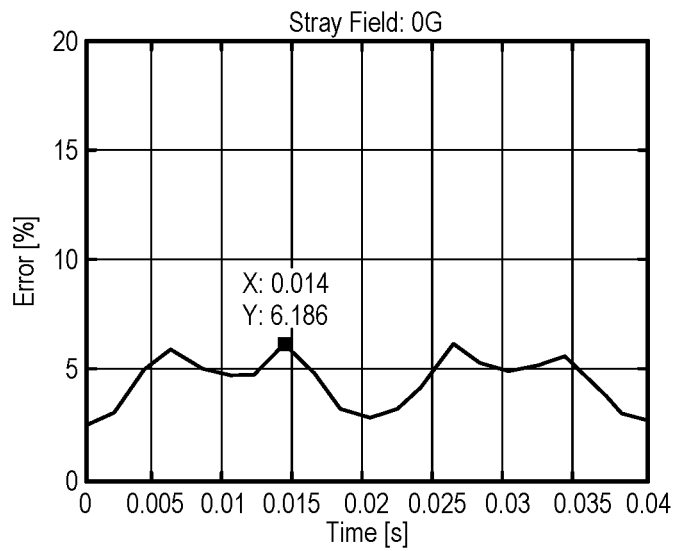

FIG. 4 is a current sensor system having a plurality of current sensors and a plurality of current carrying conductors and further showing a stray field applied to the current sensor system, according to the present disclosure. In this example, three rectangular-shaped conductors (i.e., busbars) 406a, 406b, 406n carry three independent currents I1, I2, and I3. FIG. 4 is a cross-sectional two-dimensional figure, as denoted by the X-axis and Y-axis. In this example, current is flowing in the Z direction. There are four current sensors used 404a, 404b, 404c, 404p, each having one magnetic field sensing element. These sensors 404a-404p measure the field along the Y axis only, and thus have a maximum sensitivity in the same direction. Arrow 410 indicates a stray field being applied to the current sensor system. Refer to FIGS. 5-6 illustrating example resulting magnetic field simulations from the example current sensor system shown in FIG. 4, with the distance of units in millimeters (mm) and the magnetic field unit is Gauss (G). FIG. 5 is a graphical diagram showing the measured current at various current sensors and the associated error, according to the present disclosure. FIG. 6 is a graphical diagram showing the measured current at various current sensors and the associated error when a stray field is applied, according to the present disclosure.

In FIGS. 5-6, current I1 is a cosine signal at 50 Hz with a 300 A magnitude and no offset; current I2 is a sawtooth at 80 Hz with 100 A magnitude and 100 A offset; and current I3 is constant at −200 A. FIGS. 5A, 5C, and 5E illustrate the input currents and the calculated currents, and FIGS. 5B, 5D, and 5F, respectively, illustrate the overall current measurement error in percent. FIG. 5A and FIG. 5B illustrate the example where there are a same number of current sensors as conductors (n=m=3), without stray field compensation, and showing the three input signals and the associated error (in percentage) as a function of time. FIG. 5C and FIG. 5D illustrate the example where there is one more sensor than conductor (m=4, n=3), without stray field compensation, and showing the three input signals and the associated error (in percentage) as a function of time. As evident from comparing FIG. 5B and FIG. 5D, by adding the additional current sensor, the error is reduced from approximately 10% (see FIG. 5B) down to approximately 5% (see FIG. 5D). FIGS. 5E and 5F illustrate the example where there is one more sensor than conductor (m=4, n=3) and including stray field compensation, showing, respectively, the three input signals and the associated error (in percentage) as a function of time. As evident from comparing FIG. 5F to FIGS. 5C and 5D, there is a reduction in error, and the error is approximately the same for FIG. 5D and FIG. 5F, as there is no stray field applied in this example. Further, this illustrates that by adding the stray field compensation, this does not affect the accuracy as viewing FIG. 5D compared to FIG. 5F. Meaning, the stray field compensation does not impact the measuring when there is no stray field applied. The measurement error δ, at time t, is based on the Euclidian norm of the evaluated current. A single number δ is used to represent the error, which aggregates the current errors of all 3 busbars at the same time, in order to simplify the graphical diagrams:

$$\delta(t) = \frac{\|I_{meas}(t) - I_{real}(t)\|}{\|I_{real}(t)\|}$$

The current measurement error is only due to the magnetic field measurement errors (offset and sensitivity errors) in this evaluation.

Figures 6A, 6C, 6E:
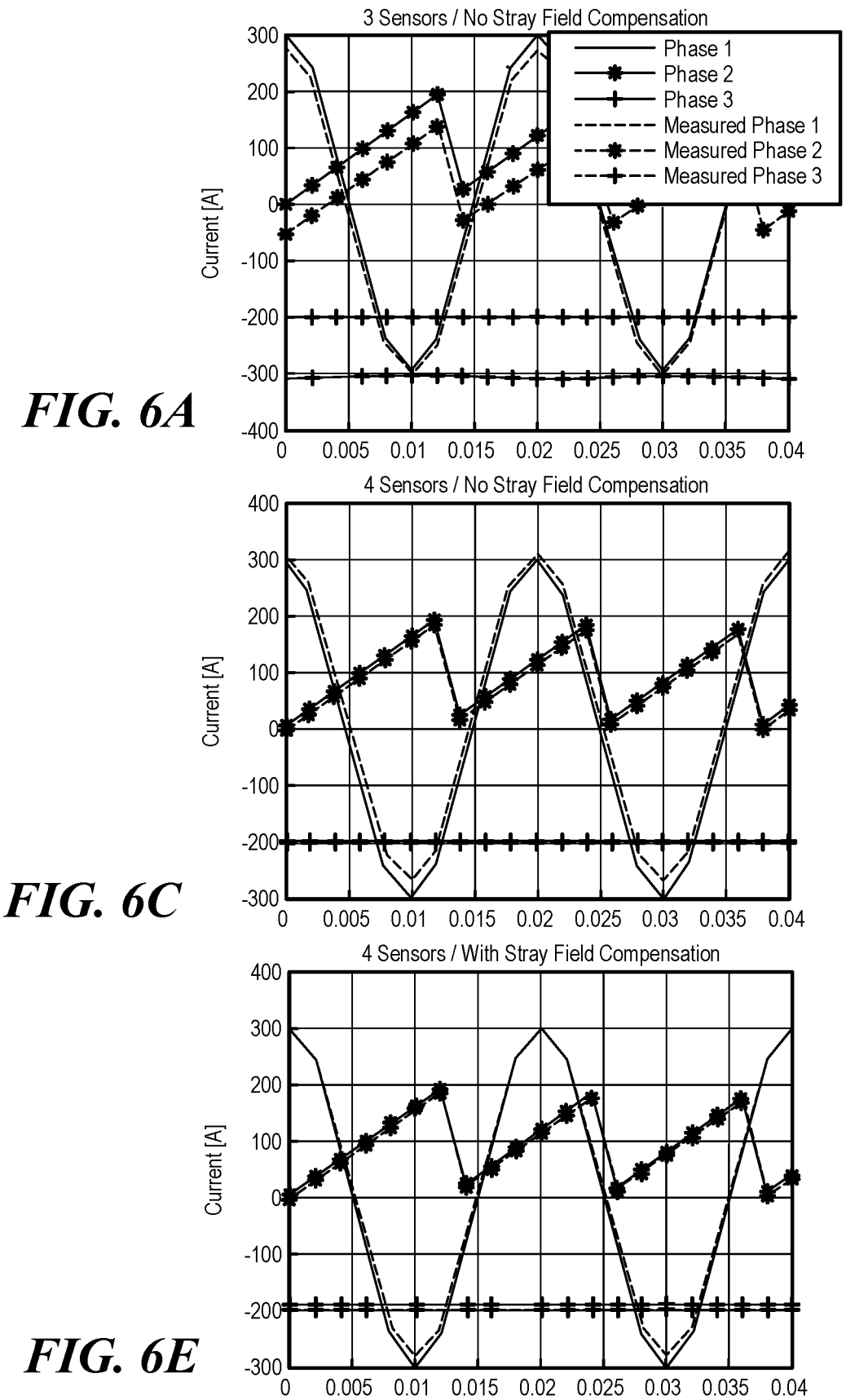
FIGS. 6A-6F are graphical diagrams showing the measured current at various current sensors and the associated error when a stray field is applied, according to the present disclosure.
Figure 6B:
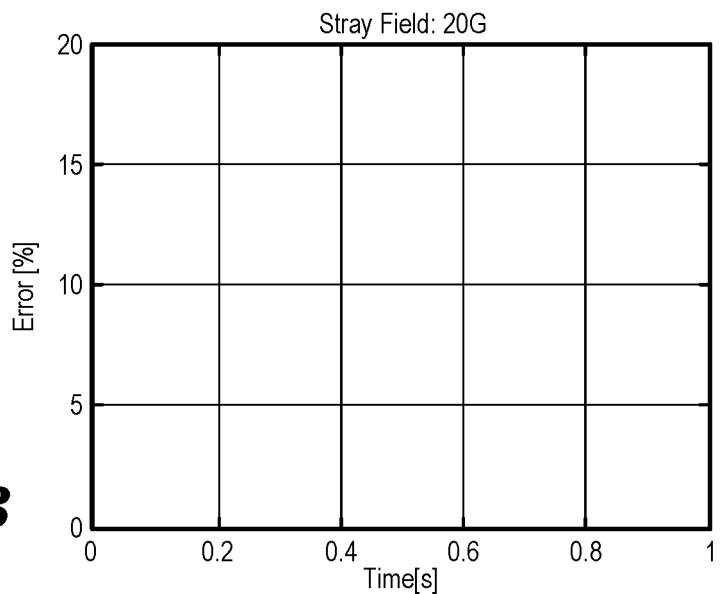
Figure 6D:
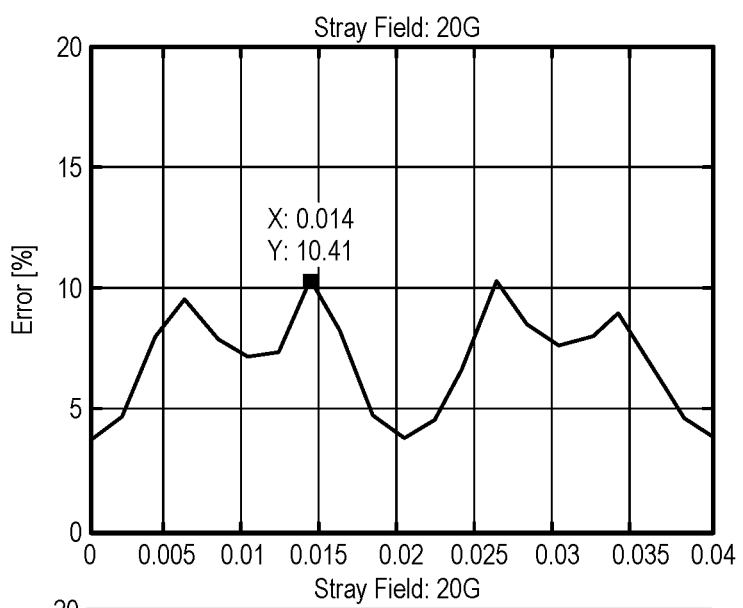
Figure 6F:
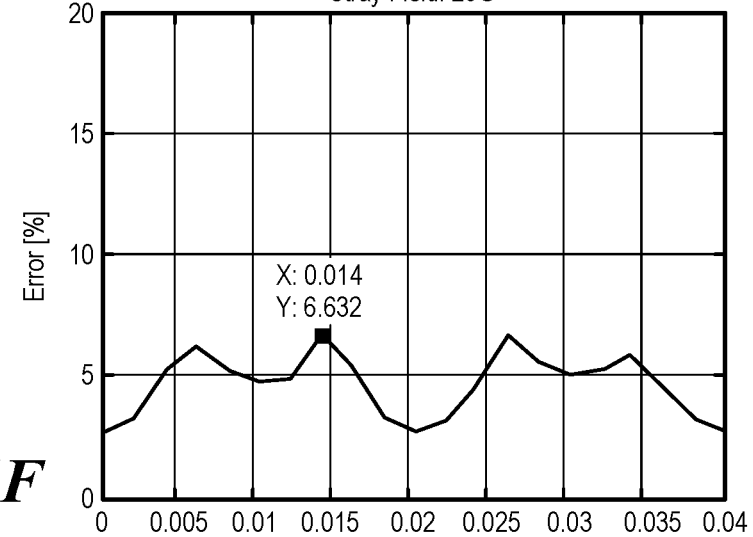

In FIG. 6, the same input currents and measurement errors are used, however a 20 G uniform stray field is applied to the system, along the measurement direction of the magnetic field sensing element (e.g., Hall plate) (axis Y), as shown, for example, by arrow 410 in FIG. 4. In the first example, FIGS. 6A and 6B, the current measurement error is now so large that it is not visible on the plot, thus it exceeds 20%, which is the maximum amount visible in the graph. In the second example, FIGS. 6C and 6D, the error is larger without the stray field compensation (shown in FIG. 6D)

however still reduced as compared to FIG. 6B, and as shown in FIGS. 6E and 6F, the error is reduced even further by applying the stray field compensation. Although the error in 6D is larger than the error in 5D, this is due to the fact that a stray field has been applied and there is no stray field compensation in FIG. 6D. Note that there is significant reduction in the case where there is just one more sensor than conductors (FIG. 6D) as compared to the case where the number of sensors is the same as the number of conductors (FIG. 6B). As illustrated in FIG. 6F, by applying the stray field compensation techniques of the present disclosure, the current measurement error remains almost constant from FIG. 5F to FIG. 6F, demonstrating the resulting immunity to a uniform stray field, according to the present disclosure.

Figure 7:
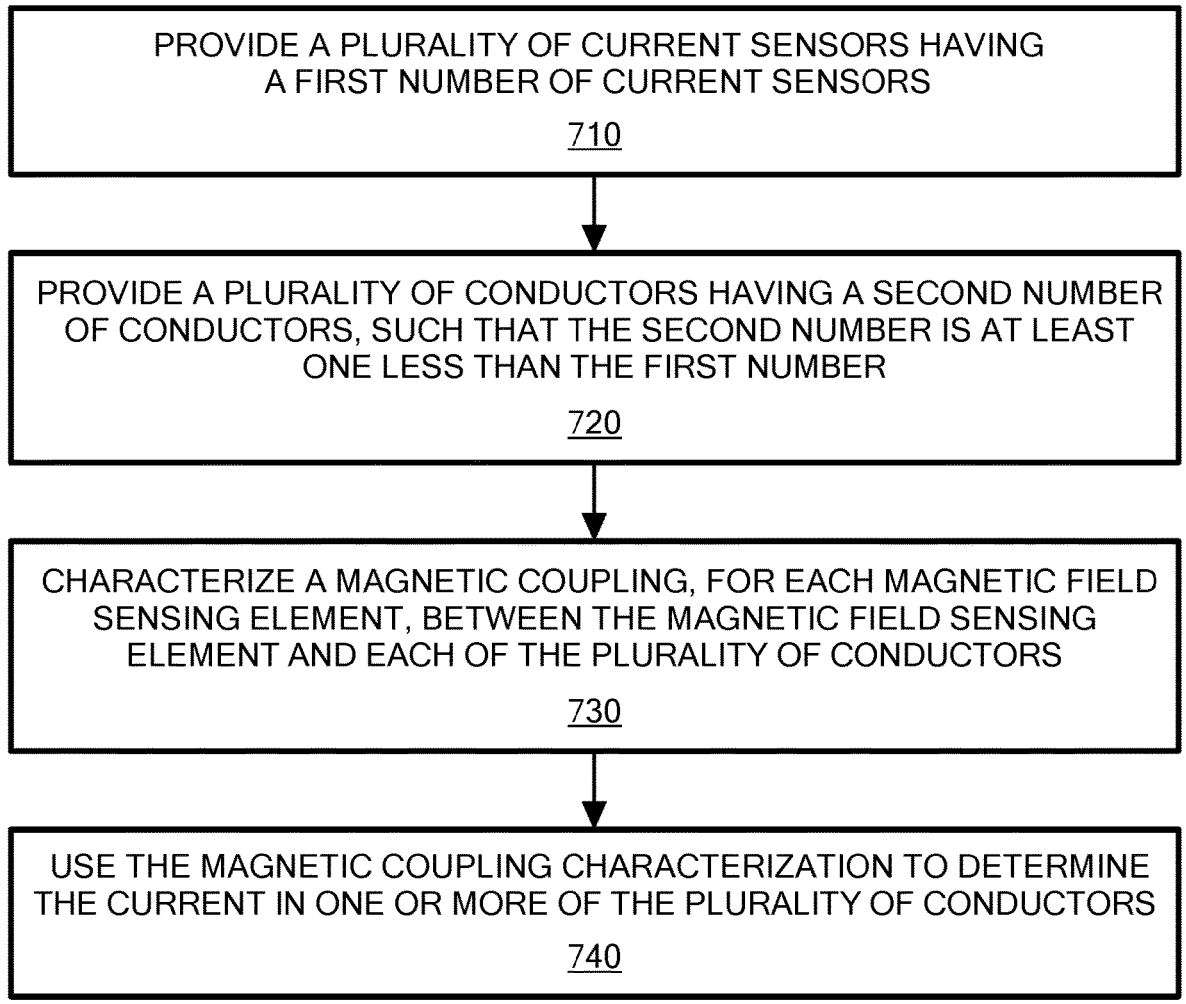
FIG. 7 is a flow diagram of a method for determining a current in one or more conductors of a current sensor system according to the present disclosure.

FIG. 7 is a flow diagram of a method for determining a current in one or more conductors of a current sensor system according to the present disclosure. The method begins at block 710 by providing a plurality of current sensors having a first number. These can be, for example, the plurality of current sensors 104a-104p in FIG. 1, or current sensors 404a-404p shown in FIG. 4. At block 720, a plurality of conductors are provided having a second number, such that the second number (of conductors) is at least one less than the first number (of sensors), meaning there is at least one more current sensor than conductor. The conductors can be, for example, the plurality of conductors 106a-106n in FIG. 1, or conductors 406a-406n in FIG. 4.

At block 730, for each magnetic field sensing element, a magnetic coupling is characterized between the magnetic field sensing element and each of the plurality of conductors. The magnetic coupling from each magnetic field sensing element to the conductors can be determined and used to compensate for unwanted coupling. The controller can generate a coupling matrix, as described in greater detail herein, comprising the one or more coupling factors for each of the magnetic field sensing elements. To determine the magnetic coupling between a magnetic field sensing element of a current sensor and each of the conductors, a reference current can be provided to each of the conductors. This may be referred to as a characterization measurement. The reference current can be provided to each of the conductors individually, or to a group of conductors simultaneously and the outputs from each of the current sensors in the current sensor system can be measured simultaneously or sequentially or the outputs from a subset of current sensors in the current sensor system can be measured (e.g., not all the current sensors in the current sensor system).

As the reference current is provided to each of the conductors, the conductors generate a magnetic field that is sensed by magnetic field sensing elements of each of the current sensors. The magnetic field sensing elements can generate a magnetic field signal corresponding to the sensed field. The current sensor includes additional circuitry (e.g., as illustrated in FIG. 3) to receive the magnetic field signal and generate an output signal (e.g., output voltage) corresponding the sensed magnetic field.

The reference current may be provided at a predetermined level that is a sufficiently high current to allow a resulting magnetic field to be detected by each of the current sensors in the system. Thus, the level of the reference current may be based at least in part on the types, dimensions, and properties of the conductors and/or the current sensors.

A coupling factor of a given magnetic field sensing element as used herein refers to the magnetic coupling between corresponding current sensor and a selected conductor.

In some embodiments, the coupling factors can be determined by dividing the magnetic field sensing element output signal by the reference current. For example, the characterization measurement yields an intended coupling factor $$\left(e.g., \alpha = \frac{U}{I}\right),$$

where I represents the current provided to the respective conductor, α represents the coupling factor, and U represents the measured output of the magnetic field sensing element. The coupling factors can be provided in units of sensor output voltage per conductor current (e.g., mV/A).

The characterization measurement can be repeated for each of the conductors in the current sensor system. The characterization measurement can be performed by a controller (e.g., controller 108 of FIG. 1) coupled to each of the current sensors. The controller can receive an output signal, responsive to the reference current provided to each of the conductors, from each of the current sensors.

In accordance with the following description of the present disclosure, there are n arbitrary number of conductors (i.e., busbars) carrying n independent currents, and there are m magnetic field sensors. In the example of FIG. 1, there are m=4 sensors and n=3 busbars carrying three currents (I1, I2 and I3). Due to the linear relationship between the magnetic field measured by the sensors and the current flowing in the busbars, it is possible to write the following Equation (1):

$$H_i = \sum_{j=1}^{n} \alpha_{i,j} \times I_j \qquad \text{Equation (1)}$$

Where $H_i$ is the magnetic field sensed by magnetic field sensing element i, $\alpha_{i,j}$ is the coupling factor between the busbar j and the magnetic field sensing element i and, is the current flowing in the busbar j. Otherwise said, $\alpha_{i,j}$ is the magnetic field sensed by magnetic field sensing element i when the current is 1 A in busbar j and there is no current in all other busbars. Each $\alpha_{i,j}$ can be calculated from magnetic field simulations or can be directly measured in the application. The direct measurement of magnetic field to determine current is desirable for higher accuracy current measurement since it compensates for mechanical mounting tolerances.

As a result, regardless of m or n, it is possible to represent the system of conductors and sensors by the following Equation (2):

$$\begin{pmatrix} \alpha_{1,1} & \cdots & \alpha_{1,n} \\ \vdots & \ddots & \vdots \\ \alpha_{m,1} & \cdots & \alpha_{m,n} \end{pmatrix} \times \begin{pmatrix} I_1 \\ \vdots \\ I_n \end{pmatrix} = \begin{pmatrix} H_1 \\ \vdots \\ H_m \end{pmatrix} \qquad \text{Equation (2)}$$

Equation (2) provides a system of equations that can also be written as a matrix Equation (3):

$$A \times I = H \qquad \text{Equation (3)}$$

As provided in the above matrix Equation (3), the coupling factors form a coupling matrix, [A], represented as follows:

$$[A] = \begin{pmatrix} \alpha_{1,1} & \cdots & \alpha_{1,n} \\ \vdots & \ddots & \vdots \\ \alpha_{m,1} & \cdots & \alpha_{m,n} \end{pmatrix}$$

The system of Equation (3) admits a unique vector I of the solution only if m=n. The vector [I] is the best fit current vector for equation (3), where [A] is the coupling matrix and [H] is a matrix comprising the magnetic field signals from the plurality of magnetic field sensing elements. In this case, the vector I is represented as follows in Equation (4):

$$I = A^{-1} \times H \quad \text{Equation (4)}$$

where $A^{-1}$ is the inverse matrix of A. Said another way, if the magnetic field is induced by n conductors with n magnetic field sensing elements, it is possible to deduce the independent current flowing in each conductor.

The coupling matrix [A] can be inverted to generate an inverse coupling matrix, $A^{-1}$. The inverse coupling matrix $A^{-1}$ can be generated by the same controller that generates the coupling matrix A (e.g., controller 108 of FIG. 1). Alternatively, the inverse coupling matrix $A_{-1}$ can be generated by a separate controller that is part of or external to the current sensor system.

To invert the coupling matrix, various techniques can be used as is known, including but not limited to: Gaussian elimination, Cayley-Hamilton method, Eigen decomposition, Cholesky decomposition, etc.

At block 740, the magnetic coupling characterization can be used to determine the current in one or more of the plurality of conductors. In an embodiment, a matrix equation [C] can be generated (e.g., by the controller 108), using the inverse coupling matrix, to determine the currents in each of the conductors—see equation (6) below. For example, the following least squares method can be used to represent the relationship between the measured currents and the measured current sensor outputs using the inverse coupling matrix. The least squares method is used to solve the matrix A×I=H (from Equation (3)) to generate a matrix [C] such that I=C×H. The magnetic field signal from each magnetic field sensing element can be multiplied by the matrix [C] to determine the current in one or more of the conductors.

In the case where m is greater than n (m sensing elements>n conductors), there is no vector I which is a strict solution of system (3) due to various errors, such as measurement errors, model errors, etc. However, one possible solution of the current vector is given by the least squares method shown in equation (5):

$$I = (A^T \times A) \times A^T \times H = C \times H \quad \text{Equation (5)}$$

$$C = (A^T \times A)^{-1} \times A^T \quad \text{Equation (6)}$$

$A^T$ is the transpose matrix of A. Equation (6) solves for matrix [C].

It will be appreciated that other options exist to solve the system of Equation (3) such as the pseudo-inverse. [C] is a matrix of dimensions n*m. Except for the specific case described herein regarding the redundancy, C is calculated only once. For example, the micro-controller 225 can evaluate currents using I=C×H=C×Vp/α and C can be stored in memory (e.g., memory 112). Calculation of matrix C can be done on a computer and the results can be stored in a microcontroller or memory associated with the microcontroller (e.g., memory 112).

In the case where there are more magnetic field sensing elements than conductors (m>n), sensor errors are mitigated, the impact of uniform stray fields are reduced, and redundancy is added to the measurement system. The current sensor system according to the present disclosure mitigates sensor errors due to increasing the number of sensors. If one sensor has a high measurement error (relative to the other sensors), the other sensor measurements will mitigate this error. The current sensor system according to the present disclosure reduces the impact of uniform stray fields without requiring differential signal processing, which doubles the number of sensors to require, for example, a minimum of 6 sensors when there are 3 conductors. The present disclosure is able to achieve stray field immunity with only 4 sensors for 3 conductors. The current sensor system according to the present disclosure adds redundancy to the measurement system because if a sensor is out of order, it is still possible to measure the current with high accuracy by removing the corresponding lines from the system equation (3). For example, if sensor j fails, line j must be removed from [A] and [H], and then [C] needs to be recalculated.

To achieve the highest Automotive Safety Integrity Level (ASIL) requirements (i.e., ASIL "D"), typically requires a redundant measurement system. In a classical conductor current measurement system (for example, concentrator based measurement) at least two magnetic field sensing elements (and in some cases at least two magnetic field-based current sensors) are required per busbar to achieve redundancy of each current measurement. Otherwise said, to achieve full redundancy, there are two times the number of sensors as compared to conductors required. However, the current sensor system of the present disclosure achieves redundancy with just one more sensor than conductor (m=n+1) sensors, and further safety can be obtained with m=n+2 or m=n+3. For example, a 3 phase system (having 3 conductors) requires 6 sensors (m=n*2) to achieve full redundancy, while a similar current sensor system according to the present disclosure would only require four (4) sensors (m=n+1), resulting in a significant cost reduction. Similarly, a 6 phase system (having 6 conductors) requires 12 sensors to achieve full redundancy, while a similar current sensor system according to the present disclosure would only require seven (7) sensors.

To further reduce the impact of uniform stray fields, which may come for example from an electrical motor nearby, the procedure described below can be used. The general example of equation (1) above can be re-written to include the stray fields in Equation (7) below:

$$H_i = H_{stray,i} + \sum_{j=1}^{n} \alpha_{i,j} \times I_j \quad \text{Equation (7)}$$

Where $H_{stray,i}$ is the magnetic stray field at sensing element i level.

Equation (7) can also be written as a system:

$$\begin{pmatrix} \alpha_{1,1} & \cdots & \alpha_{1,n} \\ \vdots & \ddots & \vdots \\ \alpha_{m,1} & \cdots & \alpha_{m,n} \end{pmatrix} I_d \times \begin{pmatrix} I_1 \\ \vdots \\ I_n \\ H_{stray,1} \\ \vdots \\ H_{stray,m} \end{pmatrix} = \begin{pmatrix} H_1 \\ \vdots \\ H_m \end{pmatrix} \quad \text{Equation (8)}$$

In this matrix, Id is the identity matrix of dimensions m*m.

The identity matrix can be represented as follows:

$$\text{Identity} = \begin{pmatrix} 1 & 0 & \cdots & 0 \\ 0 & 1 & \cdots & 0 \\ \vdots & \vdots & \ddots & \vdots \\ 0 & 0 & \cdots & 1 \end{pmatrix}$$

However, the system will always be underdetermined because there are n+m unknowns and only m measurements. Therefore, Equation (8) is not useful to achieve stray field immunity. However, if all the sensing elements are sensitive in the same direction and if the same stray field $H_{stray}$ is seen by all sensing elements (see example in FIG. 4) then Equation (7) becomes Equation (9):

$$H_i = H_{stray} + \sum_{j=1}^{n} \alpha_{i,j} \times I_j \qquad \text{Equation (9)}$$

Which simplifies system (8) into Equation (10):

$$\begin{pmatrix} \alpha_{1,1} & \cdots & \alpha_{1,n} & 1 \\ \vdots & \ddots & \vdots & \vdots \\ \alpha_{m,1} & \cdots & \alpha_{m,n} & 1 \end{pmatrix} \times \begin{pmatrix} I_1 \\ \vdots \\ I_n \\ H_{stray} \end{pmatrix} = \begin{pmatrix} H_1 \\ \vdots \\ H_m \end{pmatrix} \qquad \text{Equation (10)}$$

$$D \times J = H \qquad \text{Equation (11)}$$

System (10) has n+1 unknowns (the n currents plus the 1 stray field), and it is necessary to have at least m=n+1 sensors to solve it. Thus, since we have at least one more magnetic field sensing element than conductor, this can be solved. Equation (11) is the matrix expression of (10). It should be apparent that [D] is a coupling matrix comprising the coupling factors for each magnetic field sensing element and the stray field coefficients and that [J] is a best fit vector comprising the plurality of currents in the conductors ($I_1 \ldots I_n$) and an evaluated stray field value ($H_{stray}$).

If m=n+1, $D^{-1}$ exists and the solution of Equation (11) is shown in Equation (12):

$$J = D^{-1} \times H \qquad \text{Equation (12)}$$

If m>n+1, a solution of Equation (11) can be obtained by implementing the least squares method (or pseudo-inverse). The best fit vector [J] can be extracted for the matrix equation D×J=H, where [D] is the coupling matrix and [H] is a matrix comprising the magnetic field signals from the plurality of current sensors. The matrix equation D×J=H can be solved using an inversion method or a least squares method or a pseudo-inverse method to generate a matrix [F] such that J=F×H, as shown in Equation (13) below:

$$J = (D^T \times D)^{-1} \times D^T \times H = F \times H \qquad \text{Equation (13)}$$

$$F = (D^T \times D)^{-1} \times D^T \qquad \text{Equation (14)}$$

$$D = \begin{pmatrix} & & 1 \\ & A & \vdots \\ & & 1 \end{pmatrix} \qquad \text{Equation (15)}$$

Note that J contains the evaluated current in the conductor and also the evaluated stray field and that D comes directly from the matrix A (equation 15). Note that the stray field immunity is fully achieved only if a uniform stray field is applied to the system. If m>n+1, the redundancy described above applies also when the stray field immunity procedure is used. F is a (n+1)*m matrix. Thus, the current sensor system of the present disclosure allows stray field immunity to be achieved without using differential measurements.

It should also be apparent that the evaluated stray field value $H_{stray}$ from the best fit vector [J] can be used for the IC and/or system diagnostic and fail-safe behavior. In some cases, a uniform stray field could cause a current sensing element to operate outside of its measurement range. As such, the evaluated current ($I_1 \ldots I_n$) would not likely be accurate. The microcontroller (e.g., microcontroller 225 in FIG. 2) could have an internal threshold value as a stray field limit (e.g., ±500 G). If $H_{stray}$ is greater than the internal threshold, then a diagnostic status can be output (e.g. as diagnostic status 241 in FIG. 2) by the microcontroller. When a high stray field is detected by the microcontroller, the microcontroller can use the output (e.g., diagnostic status 241) to trigger a shutdown of the system before a failure occurs. As an example, if a short circuit occurs in the system, this can induce a very high current and as a consequence a very high magnetic field nearby. This resulting very high magnetic field could be measured as a stray field by the techniques of the present disclosure. If the system is not switched off, it could be destroyed (by fire for example). Thus, this stray field could be measured to ensure it is not above a certain threshold.

The evaluated current in the conductor is thus provided, which accounts for the stray field. The current sensors of the present disclosure have various advantages, including improved accuracy, redundancy, and immunity to uniform stray fields.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A current sensor system comprising:
   a plurality of current sensors positioned proximate to a plurality of conductors each configured to carry a current to be measured, each current sensor comprising one or more magnetic field sensing elements configured to generate a respective magnetic field signal indicative of a detected magnetic field, wherein the plurality of current sensors includes a first number of current sensors and the plurality of conductors includes a second number of conductors such that the first number is at least one more than the second number; and a controller coupled to receive the magnetic field signal from each of the plurality of current sensors, and, for each magnetic field sensing element, configured to characterize a magnetic coupling between the magnetic field sensing element and each of the plurality of conductors, wherein, for each magnetic field sensing element, the controller is further configured to:

determine a coupling factor indicative of a magnetic coupling between the magnetic field sensing element and each of the plurality of conductors; and use the coupling factors to determine the current in one or more of the plurality of conductors;

wherein the controller comprises a processor configured to generate a coupling matrix [A] comprising the coupling factors for each magnetic field sensing element, wherein the processor is further configured to extract a best fit current vector [I] for a matrix equation A×I=H, where [A] is the coupling matrix and [H] is a matrix comprising the magnetic field signals from the plurality of current sensors, wherein the processor is further configured to solve the matrix equation A×I=H using a least squares method or pseudo-inverse to thereby generate a matrix [C] such that I=C×H.

2. The current sensor system of claim 1, wherein the processor comprises a multiplier configured to multiply the magnetic field signal from each of the plurality of current sensors by the matrix [C].

3. The current sensor system of claim 1, wherein the one or more magnetic field sensing elements of each of the plurality of current sensors has a maximum sensitivity in the same direction.

4. The current sensor system of claim 3, wherein the controller comprises a processor configured to generate a coupling matrix [D] comprising the coupling factors for each of the plurality of magnetic field sensing elements and stray field coefficients.

5. The current sensor system of claim 4, wherein the processor is further configured to extract a best fit vector [J] for a matrix equation D×J=H, where [D] is the coupling matrix and [H] is a matrix comprising the magnetic field signals from the plurality of current sensors.

6. The current sensor system of claim 5, wherein the processor is further configured to solve the matrix equation D×J=H using an inversion method or a least squares method or pseudo-inverse to generate a matrix [F] such that J=F×H.

7. The current sensor system of claim 6, wherein the processor is further configured to output a diagnostic status when the evaluated stray field value exceeds the threshold value.

8. The current sensor system of claim 5, wherein the processor is further configured to compare an evaluated stray field value from the best fit vector [J] to a threshold value.

9. The current sensor system of claim 1, wherein the plurality of conductors comprise busbars.

10. The current sensor system of claim 1, wherein the one or more magnetic field sensing elements comprises one or more of magnetoresistance elements or Hall effect elements.

11. The current sensor system of claim 10, wherein the one or more magnetic field sensing elements comprises one or more giant or tunnel magnetoresistance elements.

12. A method for determining a current in one or more of a plurality of conductors, the method comprising:

providing a plurality of current sensors having a first number of current sensors, each current sensor comprising one or more magnetic field sensing elements configured to generate a respective magnetic field signal indicative of a detected magnetic field;

providing a plurality of conductors having a second number of conductors, each configured to carry a current to be measured, wherein the second number is at least one less than the first number;

for each magnetic field sensing element, characterizing a magnetic coupling between the magnetic field sensing element and each of the plurality of conductors, wherein characterizing the magnetic coupling between the current sensor and each of the plurality of conductors comprises:

determining a coupling factor indicative of a magnetic coupling between the magnetic field sensing element and each of the plurality of conductors; and generating a coupling matrix comprising one or more coupling factors for each magnetic field sensing element;

using the magnetic coupling characterization to determine the current in one or more of the plurality of conductors;

extracting a best fit current vector [I] for a matrix equation A×I=H, where [A] is the coupling matrix and [H] is a matrix comprising the magnetic field signals from the plurality of current sensors; and solving the matrix equation A×I=H using a least squares method or a pseudo-inverse to thereby generate a matrix [C] such that I=C×H.

13. The method of claim 12, further comprising:

multiplying the magnetic field signal from each magnetic field sensing element by the matrix [C].

14. The method of claim 12, wherein the one or more magnetic field sensing elements of each of the plurality of current sensors has a maximum sensitivity in the same direction, and the method further comprises:

generating a coupling matrix [D] comprising the coupling factors for each magnetic field sensing element and stray field coefficients.

15. The method of claim 14, further comprising:

extracting a best fit vector [J] for a matrix equation D×J=H, where [D] is the coupling matrix and [H] is a matrix comprising the magnetic field signals from the plurality of current sensors.

16. The method of claim 15, further comprising:

solving the matrix equation D×J=H using an inversion method or a least squares method or a pseudo-inverse to generate a matrix [F] such that J=F×H.

17. The method of claim 15, further comprising:

comparing an evaluated stray field value from the best fit vector [J] to a threshold value; and outputting a diagnostic status when the evaluated stray field value exceeds the threshold value.

18. A current sensor system comprising:

a plurality of current sensors having a first number of current sensors, each current sensor comprising one or more magnetic field sensing elements configured to generate a respective magnetic field signal indicative of a detected magnetic field;

a plurality of conductors having a second number of conductors, each configured to carry a current to be measured, wherein the second number is at least one less than the first number;

means for characterizing a magnetic coupling between each magnetic field sensing element and each of the plurality of conductors wherein the means for characterizing the magnetic coupling between the magnetic field sensing element and each of the plurality of conductors comprises:
means for determining a coupling factor indicative of a magnetic coupling between the magnetic field sensing element and each of the plurality of conductors; and
means for generating a coupling matrix comprising one or more coupling factors for each magnetic field sensing element;
means for using the magnetic coupling characterization to determine the current in one or more of the plurality of conductors;
means for extracting a best fit current vector [I] for a matrix equation A×I=H, where [A] is the coupling matrix and [H] is a matrix comprising the magnetic field signals from the plurality of current sensors; and
means for solving the matrix equation A×I=H using a least squares method or a pseudo-inverse to thereby generate a matrix [C] such that I=C×H.

19. The current sensor system of claim 18, wherein the one or more magnetic field sensing elements of each of the plurality of current sensors has a maximum sensitivity in the same direction, and the current sensor system further comprising:
means for generating a coupling matrix [D] comprising the coupling factors for each magnetic field sensing element and stray field coefficients.

20. The current sensor system of claim 19, further comprising:
means for extracting a best fit vector [J] for a matrix equation D×J=H, where [D] is the coupling matrix and [H] is a matrix comprising the magnetic field signals from the plurality of current sensors.

21. The current sensor system of claim 20, further comprising:
means for solving the matrix equation D×J=H using an inversion method or a least squares method or a pseudo-inverse to generate a matrix [F] such that J=F×H.

22. The current sensor of claim 20, further comprising:
means for comparing an evaluated stray field value from the best fit vector [J] to a threshold value; and
means for outputting a diagnostic status when the evaluated stray field value exceeds the threshold value.

23. A current sensor system comprising:
a plurality of current sensors positioned proximate to a plurality of conductors each configured to carry a current to be measured, each current sensor comprising one or more magnetic field sensing elements configured to generate a respective magnetic field signal indicative of a detected magnetic field, wherein the plurality of current sensors includes a first number of current sensors and the plurality of conductors includes a second number of conductors such that the first number is at least one more than the second number, wherein the one or more magnetic field sensing elements of each of the plurality of current sensors has a maximum sensitivity in the same direction; and
a controller coupled to receive the magnetic field signal from each of the plurality of current sensors, and, for each magnetic field sensing element, configured to characterize a magnetic coupling between the magnetic field sensing element and each of the plurality of conductors, wherein, for each magnetic field sensing element, the controller is further configured to:
determine a coupling factor indicative of a magnetic coupling between the magnetic field sensing element and each of the plurality of conductors; and
use the coupling factors to determine the current in one or more of the plurality of conductors;
wherein the controller comprises a processor configured to generate a coupling matrix [D] comprising the coupling factors for each of the plurality of magnetic field sensing elements and stray field coefficients, wherein the processor is further configured to extract a best fit vector [J] for a matrix equation D×J=H, where [D] is the coupling matrix and [H] is a matrix comprising the magnetic field signals from the plurality of current sensors, wherein the processor is further configured to solve the matrix equation D×J=H using an inversion method or a least squares method or pseudo-inverse to generate a matrix [F] such that J=F×H.

24. The current sensor system of claim 23, wherein the processor is further configured to output a diagnostic status when the evaluated stray field value exceeds the threshold value.

25. A current sensor system comprising:
a plurality of current sensors positioned proximate to a plurality of conductors each configured to carry a current to be measured, each current sensor comprising one or more magnetic field sensing elements configured to generate a respective magnetic field signal indicative of a detected magnetic field, wherein the plurality of current sensors includes a first number of current sensors and the plurality of conductors includes a second number of conductors such that the first number is at least one more than the second number, wherein the one or more magnetic field sensing elements of each of the plurality of current sensors has a maximum sensitivity in the same direction; and
a controller coupled to receive the magnetic field signal from each of the plurality of current sensors, and, for each magnetic field sensing element, configured to characterize a magnetic coupling between the magnetic field sensing element and each of the plurality of conductors, wherein, for each magnetic field sensing element, the controller is further configured to:
determine a coupling factor indicative of a magnetic coupling between the magnetic field sensing element and each of the plurality of conductors; and
use the coupling factors to determine the current in one or more of the plurality of conductors;
wherein the controller comprises a processor configured to generate a coupling matrix [D] comprising the coupling factors for each of the plurality of magnetic field sensing elements and stray field coefficients, wherein the processor is further configured to extract a best fit vector [J] for a matrix equation D×J=H, where [D] is the coupling matrix and [H] is a matrix comprising the magnetic field signals from the plurality of current sensors, wherein the processor is further configured to compare an evaluated stray field value from the best fit vector [J] to a threshold value.

26. A method for determining a current in one or more of a plurality of conductors, the method comprising:
providing a plurality of current sensors having a first number of current sensors, each current sensor comprising one or more magnetic field sensing elements configured to generate a respective magnetic field signal indicative of a detected magnetic field, wherein the one or more magnetic field sensing elements of each of the plurality of current sensors has a maximum sensitivity in the same direction;

providing a plurality of conductors having a second number of conductors, each configured to carry a current to be measured, wherein the second number is at least one less than the first number;

for each magnetic field sensing element, characterizing a magnetic coupling between the magnetic field sensing element and each of the plurality of conductors, wherein characterizing the magnetic coupling between the current sensor and each of the plurality of conductors comprises:

determining a coupling factor indicative of a magnetic coupling between the magnetic field sensing element and each of the plurality of conductors; and generating a coupling matrix comprising one or more coupling factors for each magnetic field sensing element;

using the magnetic coupling characterization to determine the current in one or more of the plurality of conductors;

generating a coupling matrix [D] comprising the coupling factors for each magnetic field sensing element and stray field coefficients;

extracting a best fit vector [J] for a matrix equation D×J=H, where [D] is the coupling matrix and [H] is a matrix comprising the magnetic field signals from the plurality of current sensors; and solving the matrix equation D×J=H using an inversion method or a least squares method or a pseudo-inverse to generate a matrix [F] such that J=F×H.

27. A method for determining a current in one or more of a plurality of conductors, the method comprising:

providing a plurality of current sensors having a first number of current sensors, each current sensor comprising one or more magnetic field sensing elements configured to generate a respective magnetic field signal indicative of a detected magnetic field, wherein the one or more magnetic field sensing elements of each of the plurality of current sensors has a maximum sensitivity in the same direction;

providing a plurality of conductors having a second number of conductors, each configured to carry a current to be measured, wherein the second number is at least one less than the first number;

for each magnetic field sensing element, characterizing a magnetic coupling between the magnetic field sensing element and each of the plurality of conductors, wherein characterizing the magnetic coupling between the current sensor and each of the plurality of conductors comprises:

determining a coupling factor indicative of a magnetic coupling between the magnetic field sensing element and each of the plurality of conductors; and generating a coupling matrix comprising one or more coupling factors for each magnetic field sensing element;

using the magnetic coupling characterization to determine the current in one or more of the plurality of conductors;

generating a coupling matrix [D] comprising the coupling factors for each magnetic field sensing element and stray field coefficients;

extracting a best fit vector [J] for a matrix equation D×J=H, where [D] is the coupling matrix and [H] is a matrix comprising the magnetic field signals from the plurality of current sensors;

comparing an evaluated stray field value from the best fit vector [J] to a threshold value; and outputting a diagnostic status when the evaluated stray field value exceeds the threshold value.

28. A current sensor system comprising:

a plurality of current sensors having a first number of current sensors, each current sensor comprising one or more magnetic field sensing elements configured to generate a respective magnetic field signal indicative of a detected magnetic field, wherein the one or more magnetic field sensing elements of each of the plurality of current sensors has a maximum sensitivity in the same direction;

a plurality of conductors having a second number of conductors, each configured to carry a current to be measured, wherein the second number is at least one less than the first number;

means for characterizing a magnetic coupling between each magnetic field sensing element and each of the plurality of conductors; and means for using the magnetic coupling characterization to determine the current in one or more of the plurality of conductors;

means for generating a coupling matrix [D] comprising the coupling factors for each magnetic field sensing element and stray field coefficients;

means for extracting a best fit vector [J] for a matrix equation D×J=H, where [D] is the coupling matrix and [H] is a matrix comprising the magnetic field signals from the plurality of current sensors; and means for solving the matrix equation D×J=H using an inversion method or a least squares method or a pseudo-inverse to generate a matrix [F] such that J=F×H.

29. A current sensor system comprising:

a plurality of current sensors having a first number of current sensors, each current sensor comprising one or more magnetic field sensing elements configured to generate a respective magnetic field signal indicative of a detected magnetic field, wherein the one or more magnetic field sensing elements of each of the plurality of current sensors has a maximum sensitivity in the same direction;

a plurality of conductors having a second number of conductors, each configured to carry a current to be measured, wherein the second number is at least one less than the first number;

means for characterizing a magnetic coupling between each magnetic field sensing element and each of the plurality of conductors; and means for using the magnetic coupling characterization to determine the current in one or more of the plurality of conductors;

means for generating a coupling matrix [D] comprising the coupling factors for each magnetic field sensing element and stray field coefficients;

means for extracting a best fit vector [J] for a matrix equation D×J=H, where [D] is the coupling matrix and [H] is a matrix comprising the magnetic field signals from the plurality of current sensors; and means for comparing an evaluated stray field value from the best fit vector [J] to a threshold value; and means for outputting a diagnostic status when the evaluated stray field value exceeds the threshold value.

* * * * *

UNITED STATES PATENT AND TRADEMARK OFFICE
CERTIFICATE OF CORRECTION

PATENT NO. : 10,884,031 B2
APPLICATION NO. : 15/999122
DATED : January 5, 2021
INVENTOR(S) : Vuillermet et al.

Page 1 of 1

It is certified that error appears in the above-identified patent and that said Letters Patent is hereby corrected as shown below:

In the Specification

Column 7, Line 64 delete "a" and replace with --$\alpha$--.

Column 8, Line 41 delete ", CBYPASS," and replace with --, $C_{BYPASS}$,--.

Column 8, Line 46 delete "CL" and replace with --$C_L$--.

Column 11, Lines 56-57 delete "corresponding the" and replace with --corresponding to the--.

Column 12, Line 40 delete "i and, is the" and replace with --$i$ and $I_j$ is the--.

Column 13, Line 23 delete "matrix A$_1$" and replace with --matrix A$_{-1}$--.

Column 13, Equation (5) delete "$I = (A^T \times A) \times A^T \times H = C \times H$" and replace with --$I = (A^T \times A)^{-1} \times A^T \times H = C \times H$--.

Signed and Sealed this
First Day of March, 2022

Drew Hirshfeld
*Performing the Functions and Duties of the
Under Secretary of Commerce for Intellectual Property and
Director of the United States Patent and Trademark Office*